(12) United States Patent
Kim et al.

(10) Patent No.: US 6,906,968 B2
(45) Date of Patent: Jun. 14, 2005

(54) INPUT BUFFER OF SEMICONDUCTOR MEMORY DEVICE

(75) Inventors: Kwang Hyun Kim, Gyeongsangbuk-do (KR); Sun Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/737,962

(22) Filed: Dec. 18, 2003

(65) Prior Publication Data

US 2004/0190353 A1 Sep. 30, 2004

(30) Foreign Application Priority Data

Mar. 28, 2003 (KR) .............................. 10-2003-0019588

(51) Int. Cl.$^7$ ................................................ G11C 7/00
(52) U.S. Cl. ................ 365/194; 365/189.05; 365/225.7
(58) Field of Search ........................... 365/194, 189.05, 365/225.7, 233

(56) References Cited

U.S. PATENT DOCUMENTS 5,986,968 A  *  11/1999  Toda et al. ............ 365/189.05
2003/0086303 A1  *  5/2003  Jeong .......................... 365/194

\* cited by examiner

*Primary Examiner*—Huan Hoang
(74) *Attorney, Agent, or Firm*—Heller Ehrman White and McAuliffe LLP

(57) ABSTRACT

An input buffer of a semiconductor memory device includes a first buffer block for buffering an input data through a delay path selected from a plurality of delay paths, and a second buffer block for buffering an input data strobe signal through a delay path selected from a plurality of delay paths, wherein the plurality of delay paths of the first buffer block and the plurality of delay paths of the second buffer block are identically formed by the same devices, and the corresponding delay paths are selected from the plurality of delay paths according to the same selecting signals. Although the input buffer fails to obtain a margin of a data setup and hold time in an input/output sense amplifier due to variations of the data setup and hold time by maximum and minimum values of tDQSS in a write operation mode, the input buffer can easily obtain the margin of the data setup and hold time in response to a special test mode signal.

10 Claims, 9 Drawing Sheets

INPUT BUFFER OF SEMICONDUCTOR MEMORY DEVICE

BACKGROUND OF THE INVENTION

1. Field of the Invention

The present invention relates to an input buffer of a semiconductor memory device, and more particularly to an input buffer of a semiconductor memory device which can solve data margin problems in an IO sense amplifier due to variations of a data setup and hold time by maximum and minimum values of a CLK to first rising edge of DQS (tDQSS), by using a special test mode signal.

2. Description of the Background Art

FIG. 1 is a concept diagram illustrating major blocks of a conventional semiconductor memory device showing a data write path. Here, a DDR SDRAM is exemplified.

The data write path of the semiconductor memory device includes an input data buffer 1, a DQS buffer 2, a DQS latch 3, a multiplexer 4 and an IO sense amplifier 5.

The DQS buffer 2 generates a rising signal DSRP and a falling signal DSFP by buffering a data strobe signal DQS. The DQS latch 3 strobes a data DQIN outputted from the input data buffer 1 with the rising signal DSRP and the falling signal DSFP.

The multiplexer 4 selectively transmits data DINRD and DINFD outputted from the DQS latch 3 to the IO sense amplifier 5.

The IO sense amplifier 5 latches and amplifies data DINTRD and DINTFD transmitted from the multiplexer 4 in response to a data strobe pulse signal DINSTBP, and transmits the data DINTRD and DINTFD to corresponding global IO lines GIOEV and GIOOD.

Here, when the data DINTRD and DINTFD are applied to the IO sense amplifier 5 by the data strobe pulse signal DINSTBP, a data setup and hold time for the data strobe signal DQS is changed according to maximum and minimum values of the DQSS.

FIG. 2 is a timing diagram showing a state where the data DINRD and DINFD are outputted late from the DQS latch 3, and a setup margin of the data strobe pulse signal DINSTBP for controlling the IO sense amplifier 5 is reduced when tDQSS has the maximum value.

As described above, the data strobe signal DQS influences a succeeding write operation. Therefore, when the strobe signals DSRP and DSFP used in the DQS latch 3 are adjusted, data windows-are controlled.

However, it has bad effects on the setup and hold time of the buffering data signal.

FIG. 3 is a timing diagram showing a state where, when a delay time of the DQS buffer 2 is reduced to solve the problem of FIG. 2, the data DINRD and DINFD are outputted fast from the DQS latch 3, and the setup margin of the data strobe pulse signal DINSTBP for controlling the IO sense amplifier 5 is improved, but the setup margin of the data DQIN from the input data buffer 1 is reduced.

In order to solve the foregoing problems, a method for performing a focused ion beam (FIB) operation on each signal, confirming resultant values thereof, and correcting the setup and hold time has been suggested.

However, it is difficult to control each path because of different delays. In addition, a mask process must be re-performed after repeated FIB operations and resulting corrections, which consumes a lot of time and expenses.

SUMMARY OF THE INVENTION

Accordingly, it is a primary object of the present invention to obtain a sufficient margin of a setup and hold time of an input/output sense amplifier in consideration of variations of the data setup and hold time by maximum and minimum values of tDQSS in a write operation mode.

Another object of the present invention is to reduce time and expenses for manufacturing a semiconductor memory device, by omitting a series of focused ion beam and mask operations for each signal.

In order to achieve the above-described objects of the invention, there is provided an input buffer of a semiconductor memory device, including: a first buffer block for buffering an input data through a delay path selected from a plurality of delay paths; and a second buffer block for buffering an input data strobe signal through a delay path selected from a plurality of delay paths, wherein the plurality of delay paths of the first buffer block and the plurality of delay paths of the second buffer block are identically formed by the same devices, and the corresponding delay paths are selected from the plurality of delay paths according to the same selecting signals.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An input buffer of a semiconductor memory device in accordance with a preferred embodiment of the present invention will be described in detail with reference to the accompanying drawings.

Figure 1:
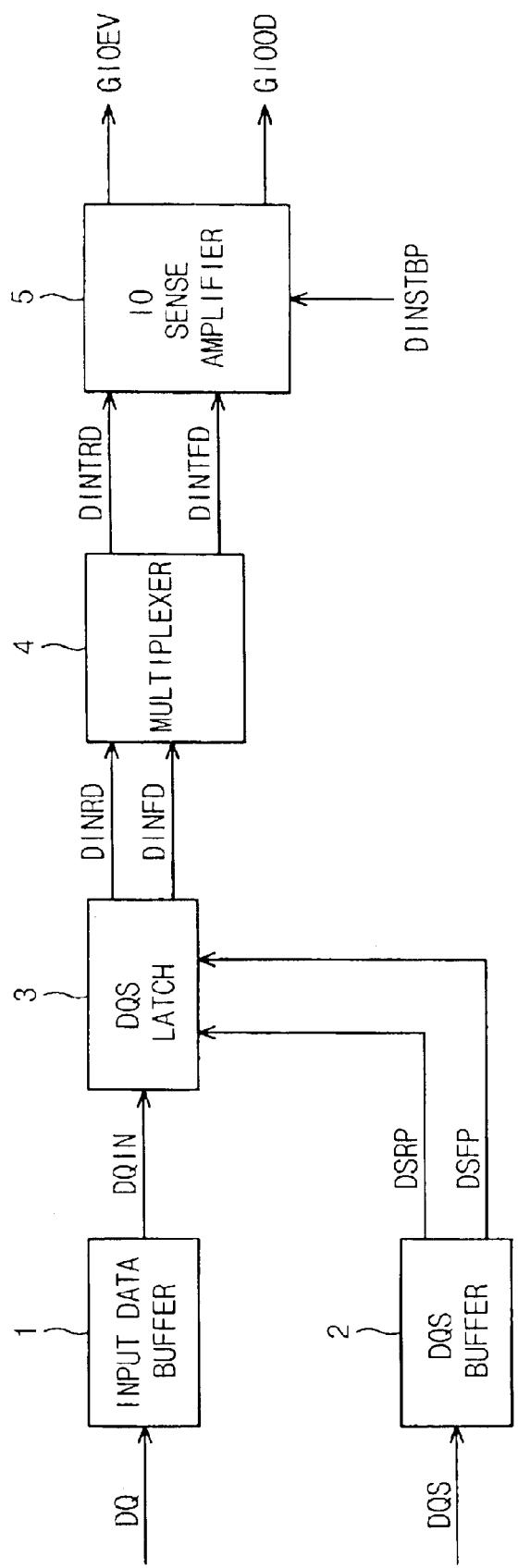
FIG. 1 is a concept diagram illustrating major blocks of a conventional semiconductor memory device showing a data write path.
Figure 2:
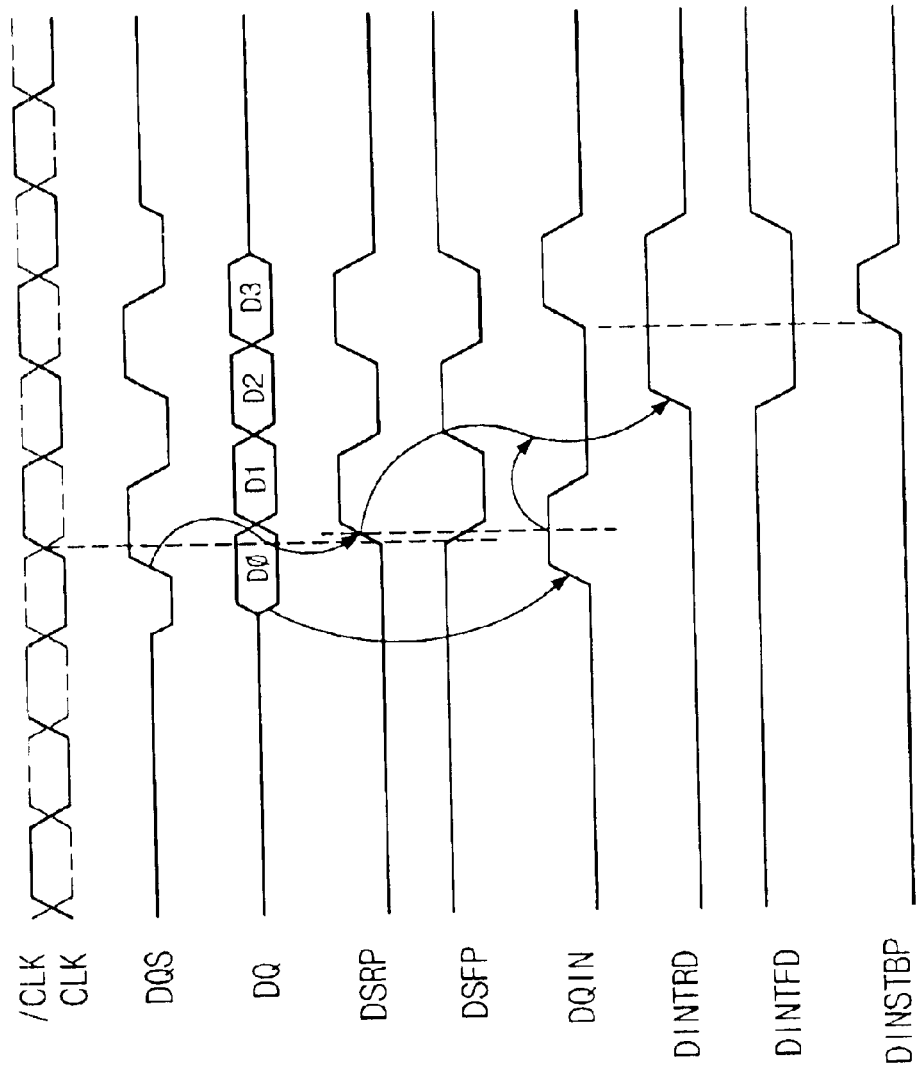
FIG. 2 is a timing diagram showing a state where a setup margin of a data strobe pulse signal for controlling an IO sense amplifier is reduced.
Figure 3:
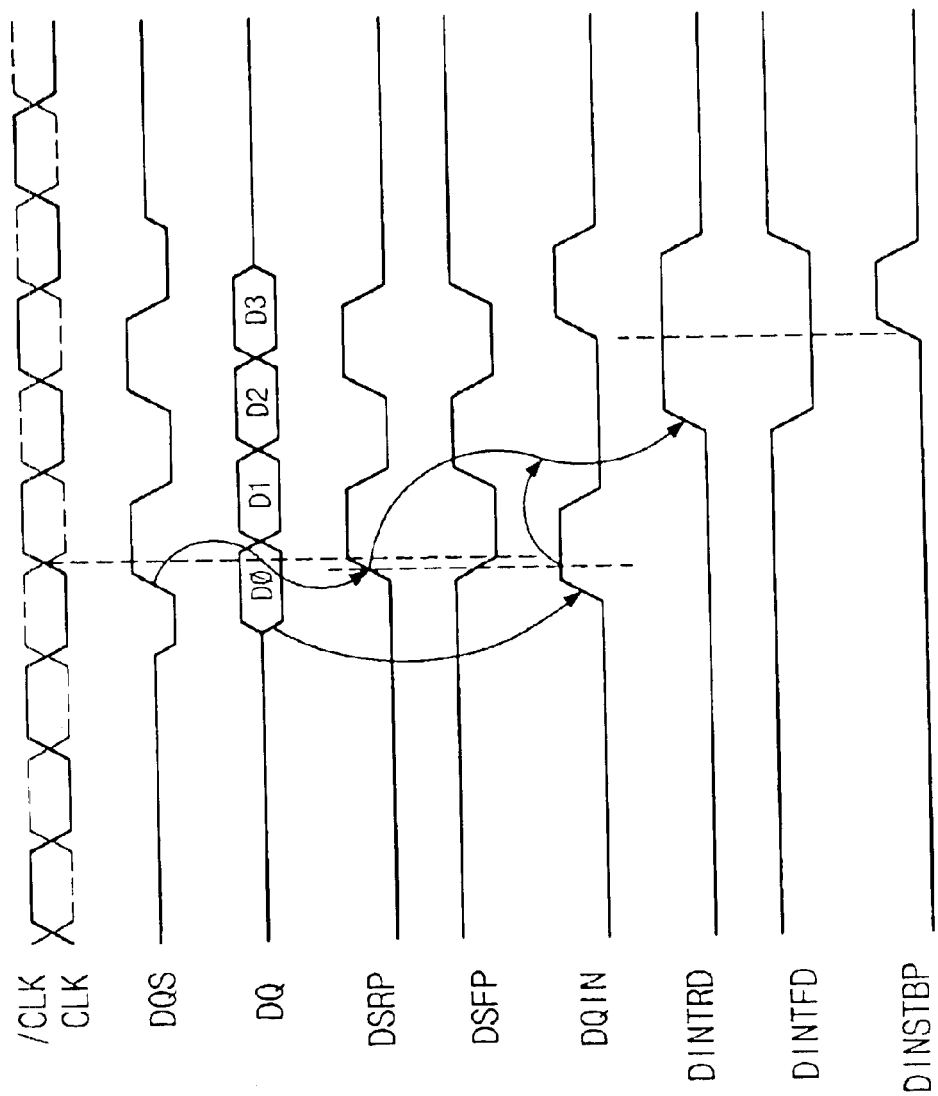
FIG. 3 is a timing diagram showing a state where a setup margin of a data outputted from a data buffer is reduced.
Figure 4:
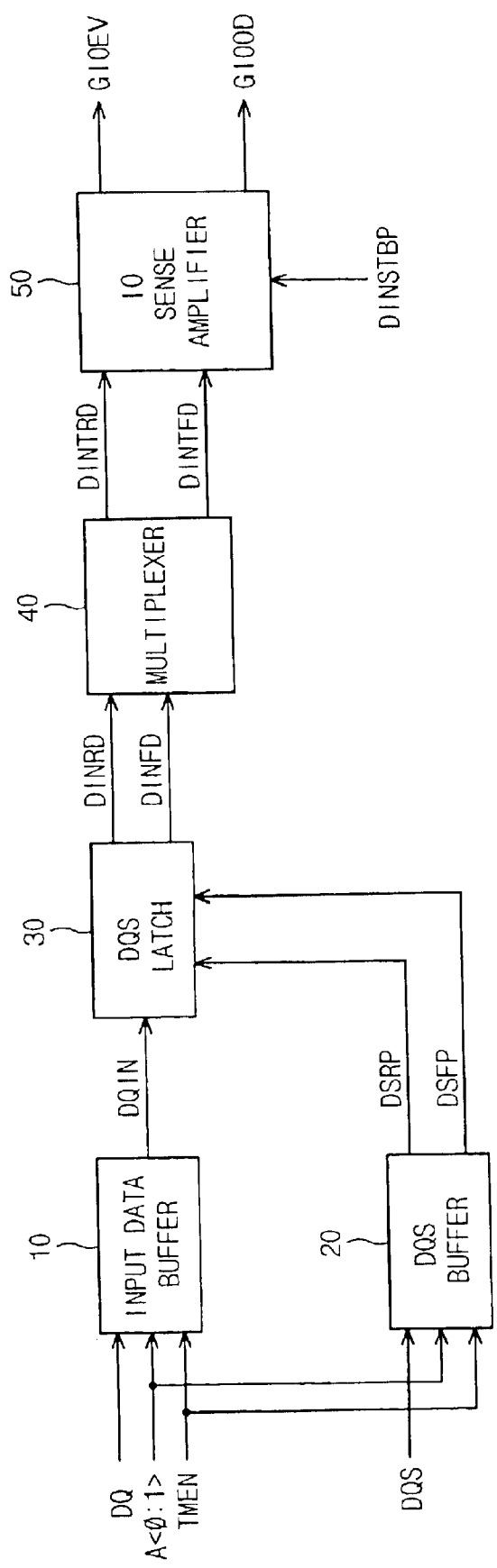
FIG. 4 is a concept diagram illustrating major blocks of a semiconductor memory device showing a data write path in accordance with the present invention.

FIG. 4 is a concept diagram illustrating major blocks of a semiconductor memory device showing a data write path in accordance with the present invention. Here, a DDR SDRAM is exemplified.

The data write path of the semiconductor memory device includes an input data buffer 10, a DQS buffer 20, a DQS latch 30, a multiplexer 40 and an IO sense amplifier 50. Here, a special test mode signal TMEN and select addresses <0:1> are transmitted to the input data buffer 10 and the DQS buffer 20.

The DQS buffer 20 generates a data DQIN outputted from the input data buffer 10 by buffering a data strobe signal DQS. The DQS latch 30 strobes the data DQIN outputted from the input data buffer 10 with a rising signal DSRP and a falling signal DSFP.

The multiplexer 40 selectively transmits signals DINRD and DINFD outputted from the DQS latch 30 to the IO sense amplifier 50.

The IO sense amplifier 50 latches and amplifies data DINTRD and DINTFD transmitted from the multiplexer 40 in response to a data strobe pulse signal DINSTBP, and transmits the data DINTRD and DINTFD to corresponding global IO lines GIOEV and GIOOD.

Figure 5:
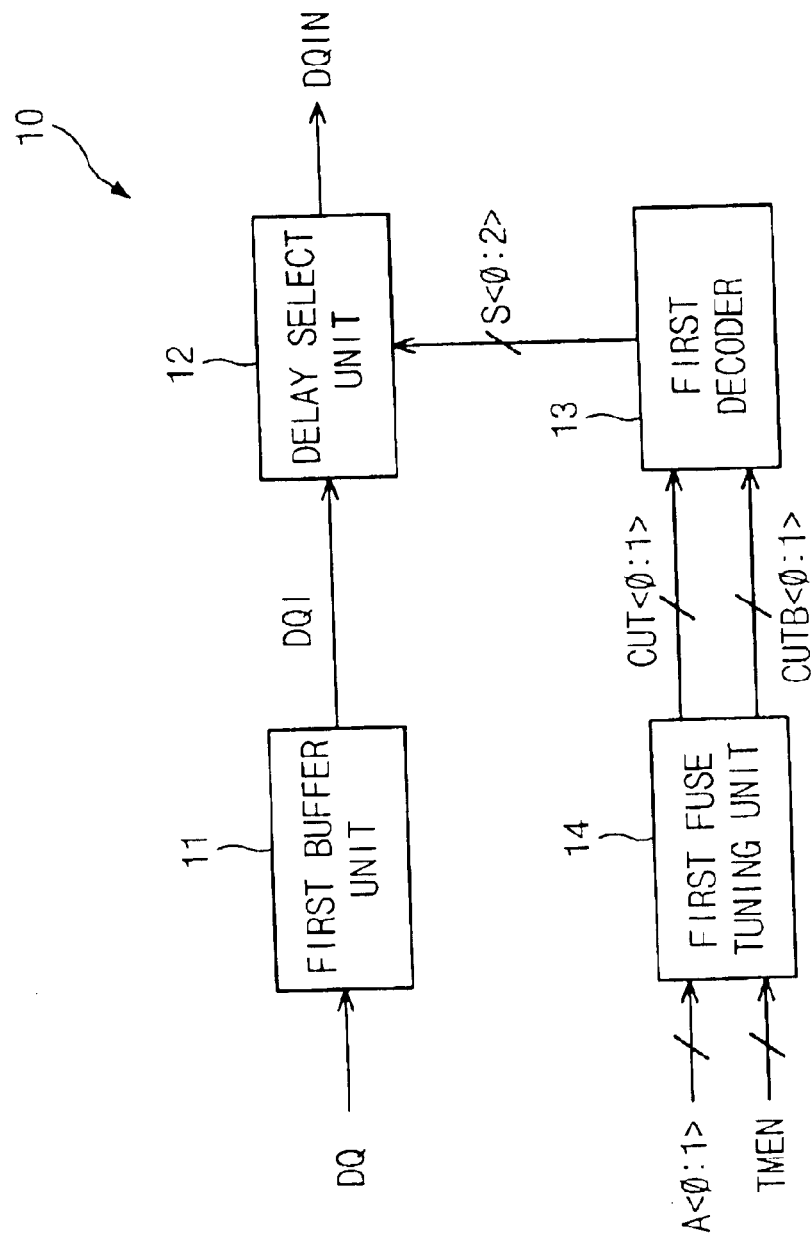
FIG. 5 is a detailed block diagram illustrating an input data buffer of FIG. 4.

FIG. 5 is a detailed block diagram illustrating the input data buffer of FIG. 4.

The input data buffer 10 includes a first buffer unit 11, a delay select unit 12, a first decoder 13 and a first fuse tuning unit 14.

The first buffer unit 11 buffers an input data DIN, and the delay select unit 12 delays the data outputted from the first buffer unit 11 through a selected delay path.

The first fuse tuning unit 14 generates signals CUT<0:1> and CUTB<0:1> for notifying fuse cutting in response to the select addresses A<0:1> and the special test mode signal TMEN, and the first decoder 13 generates selecting signals S<0:2> for selecting the delay path of the delay select unit 12 in response to the signals CUT<0:1> and CUTB<0:1> from the first fuse tuning unit 14.

Figure 6:
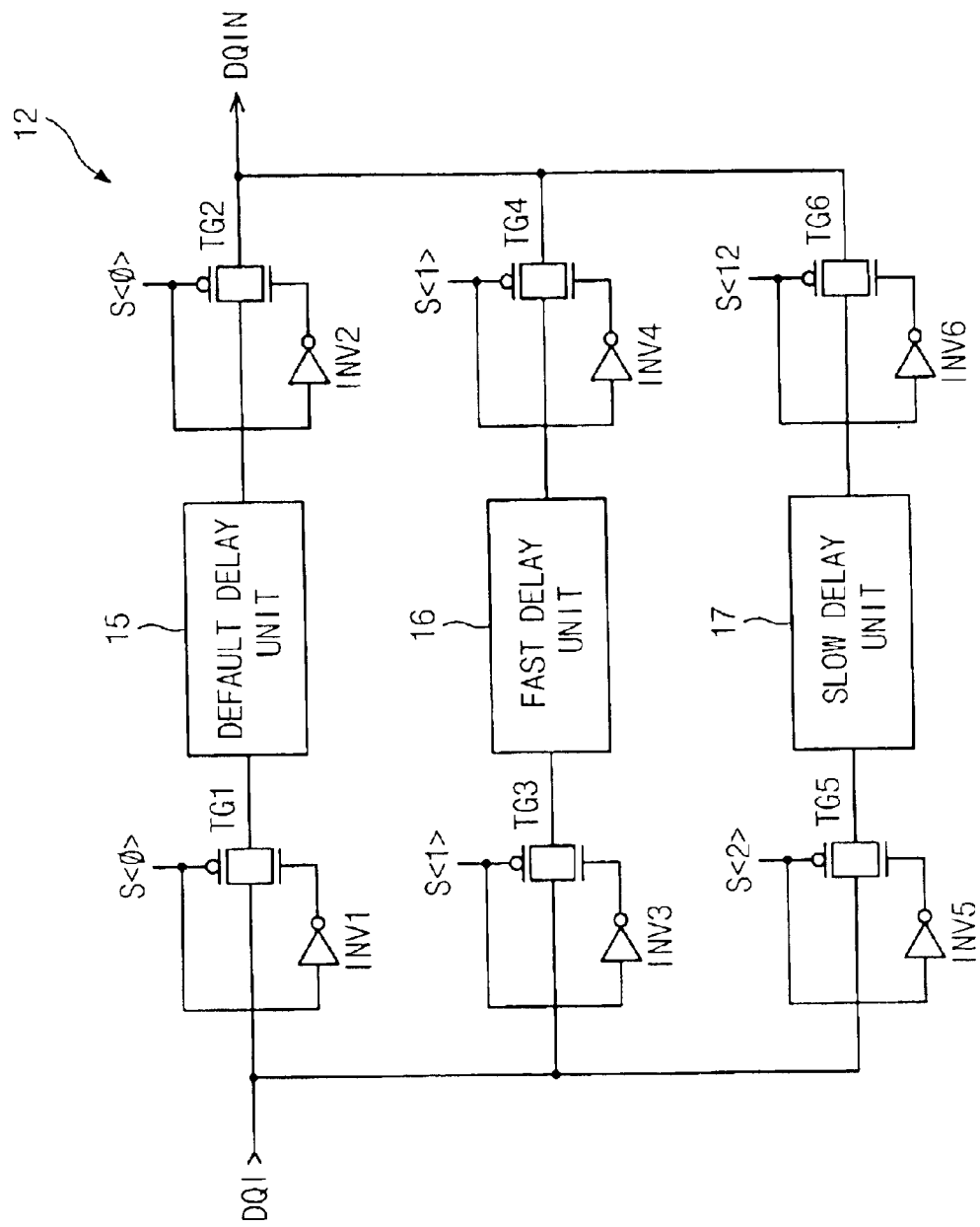
FIG. 6 is a detailed block diagram illustrating a delay select unit of FIG. 5.

FIG. 6 is a detailed block diagram illustrating the delay select unit 12 of FIG. 5.

The delay select unit 12 includes three delay units 15, 16 and 17 for delaying the data DQI from the first buffer unit 11 for a different delay time.

IO terminals of each of the delay units 15, 16 and 17 include transmission gates TG1~TG6 controlled according to the selecting signals S<0:2> from the first decoder 13 and inverted signals by inverters INV1~INV6, respectively.

Here, a delay rate of the default delay unit 15 has a normal default delay time, a delay rate of the fast delay unit 16 has a faster delay time than the default delay time, and a delay rate of the slow delay unit 17 has a slower delay time than the default delay time.

The three delay units have been exemplified, but, if necessary, more delay units having different delay rates can be added.

Figure 7:
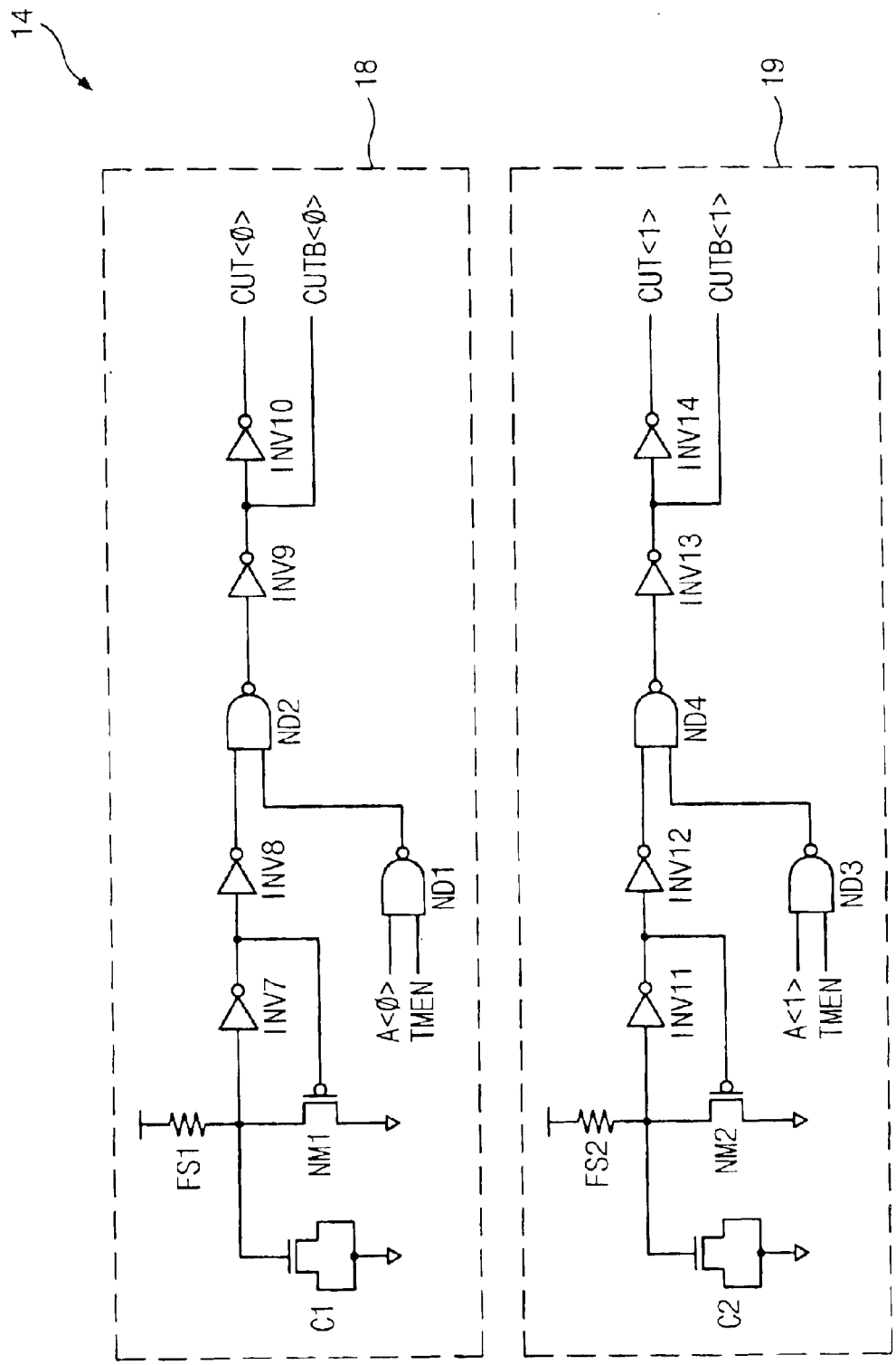
FIG. 7 is a detailed block diagram illustrating a first fuse tuning unit of FIG. 5.

FIG. 7 is a detailed block diagram illustrating the first fuse tuning unit 14 of FIG. 5.

The first fuse tuning unit 14 includes first and second fuse units 18 and 19 having the same structure for the address signals A<0:1>.

The first fuse unit 18 is comprised of a first fuse FS1 having its one terminal connected to receive power voltage, a first NMOS transistor NM1 being connected to the other terminal of the first fuse FS1, and having its gate connected to receive a potential obtained by inverting a potential of the common terminal connected to the first fuse FS1 by an inverter INV7, a first NMOS type capacitor C1 for maintaining the potential of the common terminal of the first fuse FS1 and the first NMOS transistor NM1, an inverter INV8 for inverting a potential of an output terminal of the inverter INV7, a first NAND gate ND1 for NANDing the first select address A<0> and the special test mode signal TMEN, a second NAND gate ND2 for NANDing the output signal from the inverter INV8 and the output signal from the first NAND gate ND1, and inverters INV9 and INV10 for sequentially inverting the output signal from the second NAND gate ND2. Here, the output signal from the inverter INV10 is outputted as the output signal CUT<0> and the output signal from the inverter INV9 is outputted as the inverted output signal CUTB<0>.

The second fuse unit 19 includes a second fuse FS2 having its one terminal connected to receive power voltage, a second NMOS transistor NM2 being connected to the other terminal of the second fuse FS2, and having its gate connected to receive a potential obtained by inverting a potential of the common terminal connected to the second fuse FS2 by an inverter INV11, a second NMOS type capacitor C2 for maintaining the potential of the common terminal of the second fuse FS2 and the second NMOS transistor NM2, an inverter INV12 for inverting a potential of an output terminal of the inverter INV11, a third NAND gate ND3 for NANDing the second select address A<1> and the special test mode signal TMEN, a fourth NAND gate ND4 for NANDing the output signal from the inverter INV12 and the output signal from the third NAND gate ND3, and inverters INV13 and INV14 for sequentially inverting the output signal from the fourth NAND gate ND4. Here, the output signal from the inverter INV14 is outputted as the output signal CUT<1> and the output signal from the inverter INV13 is outputted as the inverted output signal CUTB<1>.

When the fuses FS1 and FS2 of the first fuse tuning unit 14 are cut for each of the select addresses A<0:1>, the output signals CUT<0:1> have a high level, and thus the inverted output signals CUTB<0:1> have a low level.

On the other hand, when the fuses FS1 and FS2 of the first fuse tuning unit 14 are not cut for each of the select addresses A<0:1>, the output signals CUT<0:1> have a low level, and thus the inverted output signals CUTB<0:1> have a high level.

Figure 8:
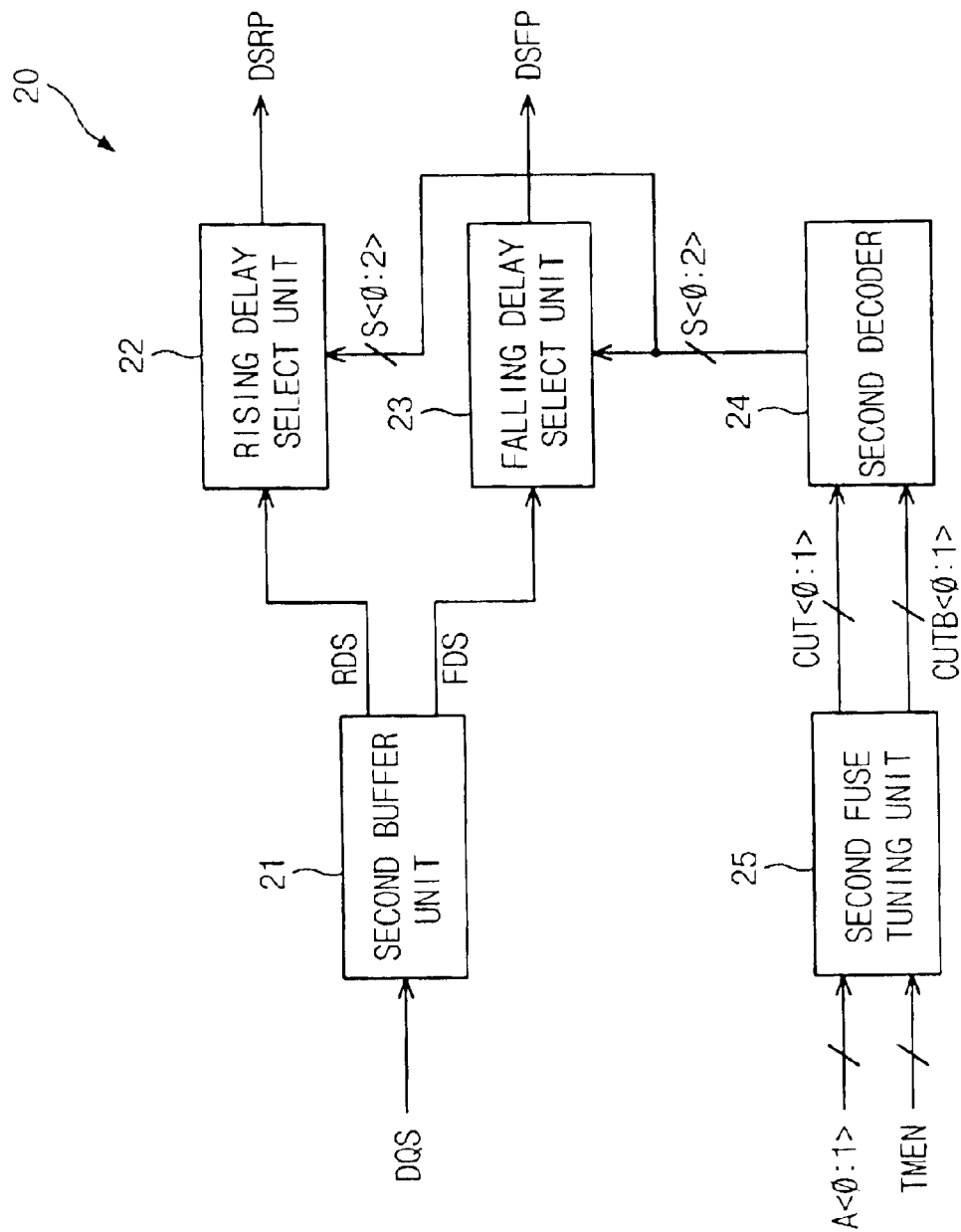
FIG. 8 is a detailed block diagram illustrating a DQS buffer of FIG. 4.

FIG. 8 is a detailed block diagram illustrating the DQS buffer 20 of FIG. 4.

The DQS buffer 20 includes a second buffer unit 21, a rising delay select unit 22, a falling delay select unit 23, a second decoder 24 and a second fuse tuning unit 25.

The second buffer unit 21 buffers an inputted data strobe signal DQS. The rising delay select unit 22 delays a rising data strobe signal RDS outputted from the second buffer unit 21 through a selected delay path. The falling delay select unit 23 delays a falling data strobe signal FDS outputted from the second buffer unit 21 through a selected delay path.

The second fuse tuning unit 25 generates the signals CUT<0:1> and CUTB<0:1> for notifying fuse cutting in response to the select addresses A<0:1> and the special test mode signal TMEN. The decoder 24 generates the selecting signals S<0:2> for selecting the delay paths of the rising delay select unit 22 and the falling delay select unit 23 in response to the output signals CUT<0:1> and CUTB<0:1> from the second fuse tuning unit 25, respectively.

Here, the rising delay select unit 22 and the falling delay select unit 23 have the same structure as the delay select unit 12 of FIG. 6, the second fuse tuning unit 25 has the same structure as the first fuse tuning unit 14 of FIG. 7, the second decoder 24 has the same structure as the first decoder 13 of FIG. 5, and thus detailed explanations thereof are omitted.

Figure 9:
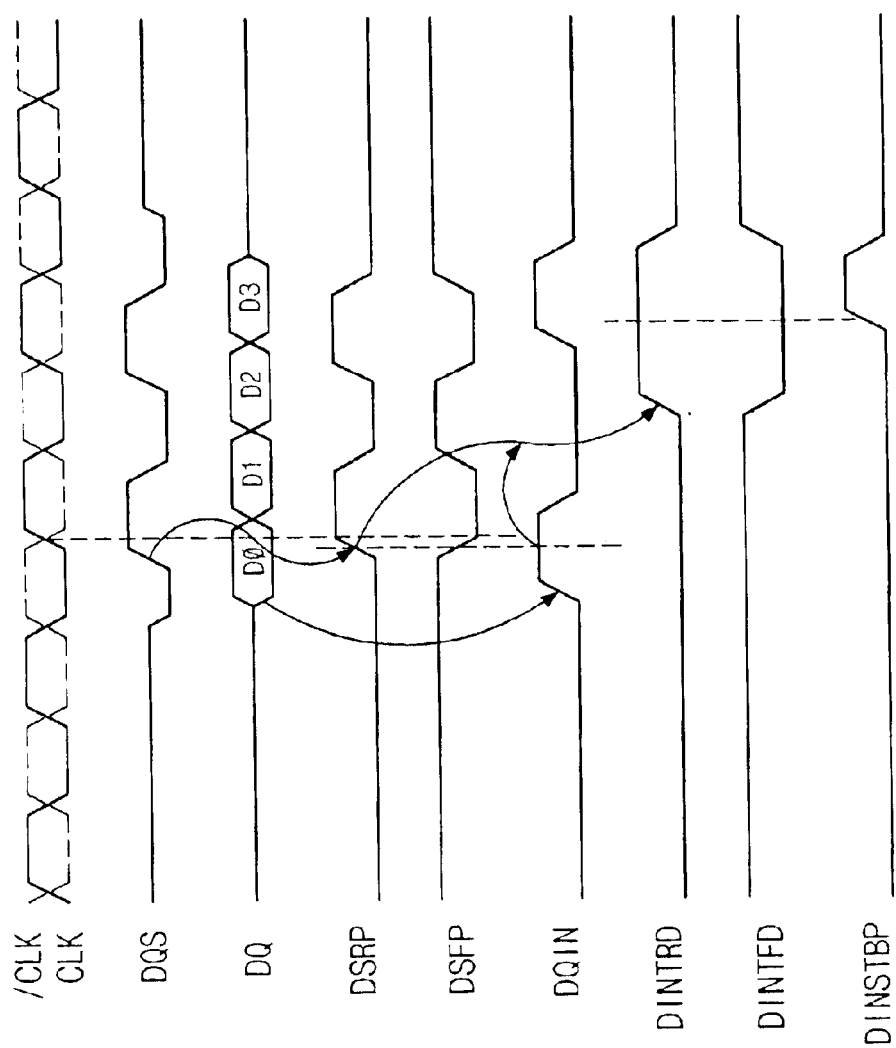
FIG. 9 is a timing diagram showing a state where a setup margin of a data strobe pulse signal for controlling an IO sense amplifier and a setup margin of a data outputted from the input data buffer are improved.

FIG. 9 is a timing diagram showing a state where, when tDQSS has the maximum value, if the data DINRD and DINFD are outputted late from the DQS latch 30 and a setup margin of the data strobe pulse signal DINSTBP for controlling the IO sense amplifier 50 is reduced, the setup margin of the data strobe pulse signal DINSTBP for controlling the IO sense amplifier 50 and the setup margin of the data DQIN outputted from the input data buffer 10 are improved at the same time, by decreasing the delay time of the input data buffer 10 and the DQS buffer 20 in the same manner.

As described above, the delay paths of the input data buffer 10 and the DQS buffer 20 are identically formed to equalize the delay time, thereby overcoming problems in correction of the setup and hold time. That is, the margin of the data setup time in the IO sense amplifier 50 as well as the margin of the input data DQIN setup time are obtained at the same time.

Here, in order to select preferable delay paths, values can be fixed by fuse trimming after correction of the setup and hold time. That is, wanted selecting signals S<0:2> are generated by the fuse tuning units 14 and 25 and the decoders 13 and 24.

The series of operations are all controlled according to the special test mode signal TMEN.

As discussed earlier, in accordance with the present invention, although the input buffer of the semiconductor memory device fails to obtain the margin of the data setup and hold time in the IO sense amplifier due to variations of the data setup and hold time by the maximum and minimum values of tDQSS in the write operation mode, it can easily obtain the margin of the data setup and hold time in response to the special test mode signal.

Furthermore, the time and expenses for manufacturing the semiconductor memory device can be remarkably reduced, by omitting a series of processes for repeating the FIB operations for each signal, confirming resultant values thereof, correcting the setup and hold time, and re-performing the mask process.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. An input buffer of a semiconductor memory device, comprising:
   a first buffer block for buffering an input data through a delay path selected from a plurality of first delay paths according to selecting signals; and
   a second buffer block for buffering an input data strobe signal through a delay path selected from a plurality of second delay paths according to the selecting signals,
   wherein the plurality of second delay paths of the second buffer block which correspond one by one to the plurality of first delay paths of the first buffer block have the same delay time.

2. The input buffer of claim 1, wherein the first buffer block comprises:
   a data buffer means for buffering the input data;
   a first delay select means for delaying the data outputted from the data buffer means through the delay path selected from the plurality of first delay paths according to the selecting signal; and
   a first selecting signal generating means for generating the selecting signal in response to a select address and a test mode signal.

3. The input buffer of claim 2, wherein the first selecting signal generating means comprises:
   a first fuse tuning means including a plurality of fuses, and selectively generating a signal for notifying fuse cutting according to a combination signal of the select address and the test mode signal; and
   a first decoding means for generating the selecting signal in response to the output signal from the first fuse tuning means.

4. The input buffer of claim 3, wherein the first fuse tuning means comprises:
   a first detecting means for detecting fuse cutting;
   a first logic means for logically combining the select address and the test mode signal; and
   a first signal generating means for logically combining the output signal from the first detecting means and the output signal from the first logic means.

5. The input buffer of claim 2, wherein the first delay select means comprises:
   a plurality of first transmitting means controlled according to the selecting signals and connected to input terminals of the plurality of first delay paths, for selectively transmitting the output data from the data buffer means; and
   a plurality of second transmitting means controlled according to the selecting signals and connected to output terminals of the plurality of first delay paths, for selectively transmitting the output data from the first delay paths.

6. The input buffer of claim 1, wherein the second buffer block comprises:
   a data strobe signal buffer means for buffering the input data strobe signal;
   a rising delay select means for delaying the rising edge detecting signal from the data strobe signal buffer means through a delay path selected from a plurality of third delay paths according to the selecting signal;
   a falling delay select means for delaying the falling edge detecting signal from the data buffer means through a delay path selected from a plurality of fourth delay paths according to the selecting signal; and
   a second selecting signal generating means for generating the selecting signal in response to the select address and the test mode signal,
   wherein the plurality of fourth delay paths of the falling delay select means which correspond one by one to the plurality of third delay paths of the rising delay select means have the same delay time.

7. The input buffer of claim 6, wherein the second selecting signal generating means comprises:
   a second fuse tuning means including a plurality of fuses, and selectively generating a signal for notifying fuse cutting according to a combination signal of the select address and the test mode signal; and
   a second decoding means for generating the selecting signal in response to the signal from the second fuse tuning means.

8. The input buffer of claim 7, wherein the second fuse tuning means comprises:
- a second detecting means for detecting fuse cutting;
- a second logic means for logically combining the select address and the test mode signal; and
- a second signal generating means for logically combining the output signal from the second sensing means and the output signal from the second logic means.

9. The input buffer of claim 6, wherein the rising delay select means comprises:
- a plurality of third transmitting means controlled according to the selecting signals and connected to input terminals of the plurality of third delay paths, for selectively transmitting the rising edge detecting signal; and
- a plurality of fourth transmitting means controlled according to the selecting signals and connected to output terminals of the plurality of third delay paths, for selectively transmitting the output signals from the third delay paths.

10. The input buffer of claim 6, wherein the falling delay select means comprises:
- a plurality of fifth transmitting means controlled according to the selecting signals and connected to input terminals of the plurality of fourth delay paths, for selectively transmitting the falling edge detecting signal; and
- a plurality of sixth transmitting means controlled according to the selecting signals and connected to output terminals of the plurality of fourth delay paths, for selectively transmitting the output signals from the fourth delay paths.

* * * * *